(12) United States Patent
Chen et al.

(10) Patent No.: US 8,441,000 B2
(45) Date of Patent: May 14, 2013

(54) HETEROJUNCTION TUNNELING FIELD EFFECT TRANSISTORS, AND METHODS FOR FABRICATING THE SAME

(75) Inventors: Xiangdong Chen, Poughquag, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 11/307,331

(22) Filed: Feb. 1, 2006

(65) Prior Publication Data
US 2007/0178650 A1    Aug. 2, 2007

(51) Int. Cl.
*H01L 29/06* (2006.01)

(52) U.S. Cl.
USPC ............ 257/38; 257/9; 257/30; 257/E21.431; 257/E29.039; 257/E29.042; 257/E29.268; 257/E45.001

(58) Field of Classification Search ............ 257/38, 257/E21.431, E29.039, E29.042, E29.268, 257/E45.001, 9, 30
See application file for complete search history.

(56) References Cited

U.S. PATENT DOCUMENTS

| | | | |
|---|---|---|---|
| 2002/0033511 A1* | 3/2002 | Babcock et al. | 257/408 |
| 2004/0031996 A1* | 2/2004 | Li et al. | 257/408 |
| 2004/0256700 A1 | 12/2004 | Doris et al. | |
| 2005/0045995 A1 | 3/2005 | Ieong et al. | |
| 2005/0106792 A1* | 5/2005 | Cea et al. | 438/197 |
| 2005/0184345 A1* | 8/2005 | Lin et al. | 257/375 |
| 2006/0043498 A1* | 3/2006 | Orlowski et al. | 257/396 |
| 2006/0258072 A1* | 11/2006 | Kavalieros et al. | 438/197 |

OTHER PUBLICATIONS

Th. Nirschl et al., "The Tunneling Field Effect Transistor (TFET) as an Add-on for Ultra-Low-Voltage Analog and Digital Processes", IEDM 04 (2004), pp. 195-198.*
P.-F. Wang et al., "Complementary tunneling transistor for low power application", Solid-State Electronics 48 (2004), pp. 2281-2286.*
Reddick et al., "Silicon surface tunnel transistor", Applied Physics Letters 67 (1995) pp. 494-496.*
J.C. Bean et al., "$Ge_xSi_{1-x}$/Si Strained-Layer Superlattice Grown by Molecular Beam Epitax." *J. Vac. Sci. Technol*, vol. 2 No. 2, 436-440 (1984).
J.H. Van Der Merwe, "Crystal Interfaces. Part I. Semi-Infinite Crystals." *J. of Appl. Phys.*, vol. 34 No. 1, 117-122 (1963).

(Continued)

*Primary Examiner* — Jay C Kim
(74) *Attorney, Agent, or Firm* — Scully, Scott, Murphy & Presser, P.C.; Joseph P. Abate, Esq.

(57) ABSTRACT

The present invention relates to a heterojunction tunneling effect transistor (TFET), which comprises spaced apart source and drain regions with a channel region located therebetween and a gate stack located over the channel region. The drain region comprises a first semiconductor material and is doped with a first dopant species of a first conductivity type. The source region comprises a second, different semiconductor material and is doped with a second dopant species of a second, different conductivity type. The gate stack comprises at least a gate dielectric and a gate conductor. When the heterojunction TFET is an n-channel TFET, the drain region comprises n-doped silicon, while the source region comprises p-doped silicon germanium. When the heterojunction TFET is a p-channel TPET, the drain region comprises p-doped silicon, while the source region comprises n-doped SiC.

5 Claims, 4 Drawing Sheets

OTHER PUBLICATIONS

J. W. Mathews and A. E. Blakeslee, "Defects in Epitaxial Multilayers." *J. Cryst. Gro.*, vol. 27, 118-125 (1974).

S.S. Iyer et al., "Heterojunction Bipolar Transistors Using Si-Ge Alloys." *IEEE Transactions on Electron Devices*, vol. 36 No. 10, 2043-2064 (1989).

R.H.M. van de Leur et al., "Critical Thickness for Pseudomorphic Growth of Si/Ge Alloys and Superlattices." J. Appl. Phys., vol. 64, 3043-3050 (1988).

D.C. Houghton et al., "Equilibrium Critical Thickness for $Si_{1-x}Ge_x$ Strained Layers on (100) Si." *Appl. Phys. Lett.* vol. 56 No. 5, 460-462 (1990).

Th. Nirschl et al., "The Tunneling Field Effect Transistor (TFET) as an Add-on for Ultra-Low-Voltage Analog and Digital Processes." IEDM 195-198 (2004).

Th. Nirschl et al., "The 65nm Tunneling Field Effect Transistor (TFET) 0.68 $\mu m^2$ 6T Memory Cell and Multi-$V_{th}$ Device." Proceedings of ESSDERC (Grenoble, France), 173-176 (2005).

Office Action dated Dec. 6, 2012 received in a related U.S. Patent Application, namely U.S. Appl. No. 13/435,994.

* cited by examiner

HETEROJUNCTION TUNNELING FIELD EFFECT TRANSISTORS, AND METHODS FOR FABRICATING THE SAME

FIELD OF THE INVENTION

The present invention relates to tunneling field effect transistors, and methods for forming the same. More specifically, the present invention relates to heterojunction field effect transistors that comprise source and drain regions of different semiconductor materials for improved tunneling current.

BACKGROUND OF THE INVENTION

As conventional complementary metal-oxide-semiconductor (CMOS) devices are scaling down, the leakage current is increased, and the device performance is degraded, due to increased short channel effects. New devices are needed to overcome these problems without requiring new materials and process steps.

The tunneling field effect transistor (TFET) is a quantum mechanical device that shows reduced short channel effects and smaller leakage currents compared to standard complementary metal-oxide-semiconductor (CMOS) devices. FIG. 1 shows an exemplary n-channel TFET 10 that is located in a p-well formed in a semiconductor substrate 12. Specifically, the n-channel TFET comprises a p-doped source region 22 and an n-doped drain region 24, which are spaced apart from each other by a channel region 23. A gate stack that comprises a gate dielectric 26 and a gate conductor 28 is located over the channel region 23.

The structure of the TFET is based on a metal-oxide-semiconductor (MOS) gated pin-diode. In the off-state, the TFET works as a low-leakage reverse biased junction diode between the source and drain regions 22 and 24. The barrier built by the reverse biased diode is larger compared to the barrier of MOSFET. This results in reduced sub-threshold leakage and suppressed direct tunneling even at very short channel lengths. When a bias is applied to the gate conductor 28, an electron channel is induced in the channel region 23. Once the channel charge concentration is degenerated, a tunneling junction is formed between the channel region 23 and the source region 22, through which the tunneling current flows.

As the TFET is scaling down from the 130 nm to the 90 nm node, use of steeper source doping gradients in the TFET has shown significant advantages in improving the performance of the tunneling junction. With the steeper source doping gradients, the on-current of the 90 nm node TFET is no longer limited by the tunneling junction only, but by the combination of the Zener diode and the MOS-channel. In the 65 nm node TFET, use of even steeper source doping gradients showed an on-current only limited by the MOS-channel. See Th. Nirschl et al., "The Tunneling Field Effect Transistor (TFET) as an Add-on for Ultra-Low-Voltage Analog and Digital Processes," IEDM (2004), pp. 195-198; see also Th. Nirschl et al., "The 65 nm Tunneling Field Effect Transistor (TFET) 0.68 µm² 6T Memory Cell and Multi-$V_{th}$ Device," Proceedings of ESSDERC (Grenoble, France 2005), pp. 173-176.

There is a continuing need for improved TFET structures with further enhanced tunneling currents.

SUMMARY OF THE INVENTION

The present invention seeks to further enhance the tunneling current of a TFET device by providing a heterojunction at the source side of the channel region of the TFET device. Such a heterojunction is formed by fabricating the source region of the TFET device using a semiconductor material that has a different band gap than the semiconductor material used for forming the remaining components of the TFET device.

It has been discovered that the tunneling current of a TFET device depends not only on the abruptness of the source doping gradient, but also on the band gap of the material used for forming the TFET device. Therefore, a heterojunction formed by a suitable semiconductor material of a different band gap can be constructed and arranged to further enhance the junction current in the TFET device. For example, silicon germanium has a smaller band gap than silicon, and it can therefore be used to form the source region of an n-channel TFET device,—thereby providing an abrupt junction between the source and channel regions for further enhancing the tunneling current in the n-channel TFET device. On the other hand, silicon doped with carbon (hereafter "SiC") can be used to form the source region of a p-channel TFET device for further enhancing the tunneling current in the p-channel TFET device.

In one aspect, the present invention relates to a tunneling field effect transistor (TFET) comprising:
  a drain region that comprises a first semiconductor material of a first conductivity type;
  a source region spaced apart from the drain region, wherein the source region comprises a second, different semiconductor material of a second, different conductivity type;
  a channel region located between the source and drain regions; and
  a gate stack located over the channel region, wherein the gate stack comprises at least a gate dielectric and a gate conductor.

In another aspect, the present invention relates to a semiconductor device comprising:
  a semiconductor substrate,
  a tunneling field effect transistor (TFET) comprising spaced apart source and drain regions with a channel region located therebetween and a gate stack located over the channel region, wherein the source, drain, and channel regions of the TFET are located in the semiconductor substrate, wherein the drain region of the TFET comprises a first semiconductor material of a first conductivity type, wherein the source region of the TFET comprises a second, different semiconductor material of a second, different conductivity type, and wherein the gate stack of the TFET comprises at least a gate dielectric and a gate conductor; and
  a metal-oxide-semiconductor field effect transistor (MOSFET) adjacent to the TFET, wherein the MOSFET comprises spaced apart source and drain regions with a channel region located therebetween and a gate stack located over the channel region, and wherein the source, drain, and channel regions of the MOSFET are located in the semiconductor substrate.

In a further aspect, the present invention relates to a method for forming a tunneling field effect transistor (TFET), comprising:
  providing a semiconductor substrate that comprises a first semiconductor material;
  forming a gate stack over the semiconductor substrate, wherein said gate stack comprises at least a gate dielectric and a gate conductor;
  doping the semiconductor substrate to form a first doped region and a second doped region in the semiconductor substrate, wherein the first and second doped regions both are doped with a first dopant species of a first conductivity type and are spaced apart from each other by the gate stack;

selectively etching the second doped region to form a recess in the semiconductor substrate;

selectively forming a semiconductor structure in the recess, wherein said semiconductor structure comprises a second, different semiconductor material of a second, different conductivity type, thereby forming a TFET, which comprises a drain region formed by the first doped region, a source region formed by the semiconductor structure, and a channel region that is located between and defined by the source and drain regions with the gate stack located over the channel region.

Other aspects, features and advantages of the invention will be more fully apparent from the ensuing disclosure and appended claims.

DETAILED DESCRIPTION OF THE INVENTION AND PREFERRED EMBODIMENTS THEREOF

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present invention provides a heterojunction TFET structure for further enhancing the tunneling current in the TFET device.

Specifically, the drain region of the heterojunction TFET of the present invention comprises a first semiconductor material (e.g., Si, Ge, SiGe, SiC, or any other Group III-V semiconductor material) of a first conductivity type (i.e., either n- or p-type conductivity). The source region of the heterojunction TFET of the present invention, which is spaced apart from the drain region, comprises a second semiconductor material that is different from the first semiconductor material (e.g., Si, Ge, SiGe, SiC, or any other Group III-V semiconductor material, but different from the drain semiconductor), which has a second conductivity type that is different from the first conductivity type (i.e., either p- or n-type conductivity). The channel region located between the source and drain regions also comprises the first semiconductor material having the first conductivity type, while the bandgap of the drain region is smaller than that of the channel region. In this manner, an abrupt heterojunction (which refers to the junction between the source region and the channel region) is formed between the channel region and the source region of the TFET. Such an abrupt heterojunction functions to further enhance the tunneling current.

Figure 1:
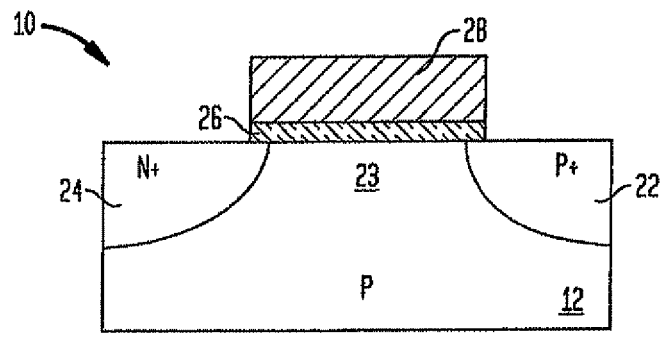
FIG. 1 shows a cross-sectional view of a conventional n-channel TFET.
Figure 2:
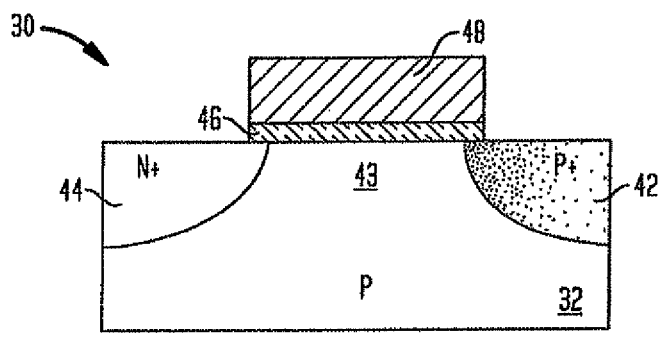
FIG. 2 shows a cross-sectional view of an exemplary SiGe-based heterojunction n-channel TFET, according to one embodiment of the present invention.

FIG. 2 shows a cross-sectional view of an exemplary heterojunction n-channel TFET 30, according to one embodiment of the present invention.

The heterojunction n-channel TFET 30 is preferably fabricated on a semiconductor substrate 32, which may comprise any semiconductor material including, but not limited to: Si, Ge, SiGe, SiC, SiGeC, Ga, GaAs, InAs, InP and all other III/V or II/VI compound semiconductors. Semiconductor substrate 32 may also comprise an organic semiconductor or a layered semiconductor such as Si/SiGe, a silicon-on-insulator (SOI) or a SiGe-on-insulator (SGOI). Preferably, the semiconductor substrate 32 is composed of a Si-containing semiconductor material, i.e., a semiconductor material that includes silicon. For example, the semiconductor substrate 32 may consist essentially of silicon (e.g., single crystalline, polycrystalline, amorphous, or a mixture thereof) in a bulk form. Alternatively, the semiconductor substrate 32 may comprise a SOI structure that contains a thin silicon layer located over a buried insulator layer, which functions to reduce the leakage current in the substrate.

The semiconductor substrate 32 may be doped, undoped or contain both doped and undoped regions therein. The semiconductor 32 may also include a first doped (n- or p-) region and a second doped (p- or n-) region. The first doped region and the second doped region may be the same, or they may have different conductivities and/or doping concentrations. These doped regions are known as "wells" and can be used to define various device regions.

Further, the semiconductor substrate 32 can be a hybrid substrate, which comprising at least one region (e.g., the n-channel FET device region) in which mobility of electrons is enhanced, and another region (e.g., the p-channel FET device region) in which mobility of holes is enhanced. By fabricating the n-channel FET in the electron-mobility-enhanced region and the p-channel FET in the hole-mobility-enhanced region, the mobility of the respective charge carriers (i.e., either electrons or holes) in the n-channel FET and p-channel FET device regions can simultaneously be enhanced, thereby improving the CMOS device performance.

More specifically, the semiconductor substrate 32 can be a hybrid substrate that comprises different regions of different crystal orientations (which is referred to herein as a hybrid crystal orientation substrate). Functionality of such hybrid crystal orientation substrates is based on the anisotropy of carrier mobility in the semiconductor crystals. Specifically, the mobility of charged carries such as electrons and holes varies with the crystal orientation of the semiconductor substrate. For example, hole mobility is enhanced for a (110) surface in comparison to a (100) surface in silicon substrate, but electron mobility is enhanced for the (100) silicon surface as compared to the (110) surface. Therefore, by fabricating the n-channel FET in a device region having the (100) surface crystal orientation, and the p-channel FET in a different device region having the (110) surface crystal orientation, the mobility of the respective charge carriers (i.e., either electrons or holes) in the n-channel FET and p-channel FET device regions are both enhanced. Such carrier mobility anisotropy also exists in other semiconductor materials, such as other group IV semiconductor materials as well as group III-V and II-VI compounds, and the hybrid crystal orientation technology (which is typically referred to as the HOT technology) therefore is readily applicable to substrates composed of such other semiconductor materials. The hybrid crystal orientation substrate can be formed, for example, by a method that includes wafer bonding, selective etching and regrowth of a semiconductor layer, as described, for example, in U.S. patent applications Ser. Nos. 10/250,241 and 10/932,982, the content of which is incorporated herein by reference in its entirety for all purposes.

In a particularly preferred embodiment of the present invention, the heterojunction n-channel TFET 30 is fabricated on a p-well of the semiconductor substrate 32, as shown in FIG. 2. The p-well functions to isolate the n-channel TFET 30 from other devices (not shown) located on the semiconductor substrate 32 to the periphery of the TFET device 30.

Alternatively or additionally, at least one isolation region (not shown) can be provided in the semiconductor substrate 32 to isolate the n-channel TFET 30. The isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process.

The n-channel TFET 30 comprises a source region 42, a drain region 44, a channel region 43 located between the source and drain regions 42 and 44. A gate stack, which comprises a gate dielectric 46 and a gate conductor 48, is located over the channel region 43.

The drain region 44 of the n-channel TFET 30 comprises a first semiconductor material that is doped with an n-type dopant species. The first semiconductor material can comprise Si, Ge, SiGe, SiC or any other Group III-V semiconductor material. The n-type dopant species can be an element from Group IIIA of the Periodic Table of the Elements, such as nitrogen, phosphorous, arsenic, antimony, etc. The channel region 43 also comprises the first semiconductor material and is doped with the n-type dopant species.

The source region 42 of the n-channel TFET 30, on the other hand, comprises a second semiconductor material, which is different from that of first semiconductor material. The second semiconductor material is selected from the group consisting of Si, Ge, SiGe, SiC or any other Group III-V semiconductor material. Further, the source region 42 includes a p-type dopant species, which can be an element from Group VA of the Periodic Table of the Elements, such as aluminum, boron, gallium, indium, etc.

Figure 4:
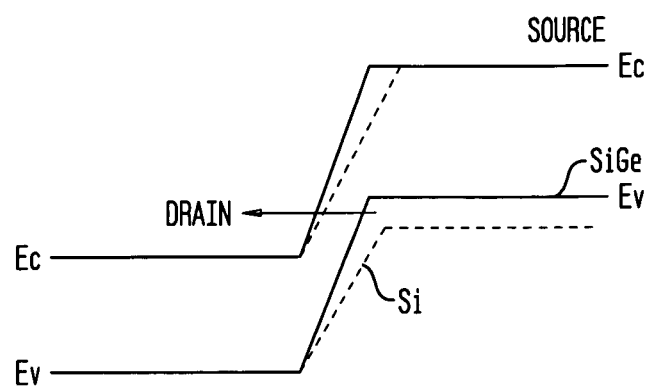
FIG. 4 shows the band graph of the SiGe-based heterojunction n-channel TFET of FIG. 2, in comparison with that of a conventional n-channel TFET.

Preferably, the drain region 44 comprises silicon, and the source region 42 comprises silicon germanium. Silicon germanium has a smaller band gap than that of silicon. Therefore, by forming the source region 42 with silicon germanium and the drain region 44 with silicon, a more abrupt junction with a smaller band gap is formed, as shown in FIG. 4 (the solid line indicates the band graph of a SiGe p+ source, in comparison with the band graph of a Si p+ source indicated by the dashed line). Since the tunneling current $I=A\times exp^{(-Eg/2\kappa T)}$, wherein A is a multiplicity factor, and Eg is the band gap of the semiconductor material used for forming the source region, provision of such an abrupt junction with a smaller band gap functions to enhance the tunneling current.

Preferably, the germanium content in the source region 42 at the junction immediately adjacent to the channel region 43 should not exceed the critical germanium content allowed. The term "critical germanium content allowed" is defined hereinbelow.

Pseudomorphically grown SiGe films contain intrinsic strain caused by lattice mismatch between the silicon substrate (having a smaller lattice constant) and the SiGe film (having a larger lattice constant). When the strain reaches a critical level, either due to increase of the SiGe film thickness or increase of the Ge content, it can no longer be contained by elastic energy stored in the distorted SiGe crystal structure. Instead, a portion of the strain will be relaxed through generation of misfit dislocations in the heteroepitaxial interface. Therefore, for a SiGe film of a specific Ge content, there exists a "critical thickness," defined as the maximum thickness for the pseudomorphic growth of the SiGe film, below which the strain caused by lattice mismatch between Si and Ge is contained by elastic energy stored in crystal lattice distortion, and above which a portion of the strain is relaxed through generation of misfit dislocations in the heteroepitaxial interface. Similarly, for a SiGe film of a specific thickness, there exists a "critical Ge content," which is defined as the maximum germanium content that can be incorporated into the pseudomorphic SiGe film below which the strain caused by lattice mismatch between Si and Ge is contained by elastic energy stored in crystal lattice distortion, and above which a portion of the strain is relaxed through generation of misfit dislocations in the heteroepitaxial interface. Dislocation defects originated from strain relaxation are electrically active and can cause increased carrier scattering, carrier trapping, and carrier recombination. Therefore, it is preferred to maintain the Ge content and the thickness of a SiGe-containing layer below the critical values, in order to avoid formation of dislocation defects in the device structure.

Critical germanium content for a SiGe-containing layer can be readily calculated by various conventionally known methods, as described by J. C. Bean et al., "$Ge_xSi_{1-x}$/Si Strained-Layer Superlattice Grown by Molecular Beam Epitaxy," J. VAC. Sci. TECHNOL., Vol. A2, No. 2, pp. 436-440 (1984); J. H. van der Merwe, "Crystal Interfaces. Part I. Semi-Infinite Crystals," J. APPL. PHYS., Vol. 34, No. 1, pp. 117-122 (1963); J. M. Matthews and A. E. Blakeslee, "Defects in Epitaxial Multilayers I. Misfit Dislocations in Layers," J. CRYSTAL GROWTH, Vol. 27, pp. 118-125 (1974); S. S. Iyer et al., "Heterojunction Bipolar Transistors Using Si-Ge Alloys," IEEE TRANSACTIONS ON ELECTRON DEVICES, Vol. 36, No. 10 (October 1989); R. H. M. van der Leur et al., "Critical Thickness for Pseudomorphic Growth of Si/Ge Alloys and Superlattice," J. APPL. PHYS., Vol. 64, No. 5, pp. 3043-3050 (15 Sep. 1988); and D. C. Houghton et al., "Equilibrium Critical Thickness for $Si_{1-x}Ge_x$ Strained Layers on (100) Si," APPL. PHYS. LETT., Vol. 56, No. 5, pp. 460-462 (29 Jan. 1990).

Typically, the critical germanium content is about 30 atomic %, but the specific critical germanium content depends on the thickness of the SiGe-containing layer. Therefore, it is preferred that the germanium content in the source region 42 at the junction immediately adjacent to the channel region 43 is less than or equal to about 30 atomic %, and more preferably ranges from about 10 atomic % to about 30 atomic %.

The SiGe-containing source region 42 of the present invention may have a flat Ge content profile (i.e., a substantially uniform Ge content is provided across the entire source region 42), a multi-step Ge content profile (i.e., multiple plateaus of uniform Ge content are provided across the entire source region 42), or a graded Ge content profile (i.e., the Ge content in the source region 42 gradually increases or decreases), provided that the germanium content at the junction immediately adjacent to the channel region 43 is equal to or close to the critical germanium content. Preferably, the source region 42 has a graded Ge content profile, which may have any suitable shape, either regular or irregular and which decreases along a direction away from the channel region 43.

The gate dielectric 46 of the n-channel TFET 30 may comprise any suitable gate dielectric material, such as semiconductor oxides, semiconductor oxynitrides, metal oxides, and combinations and multilayers thereof. High k dielectric materials (with dielectric constants greater than that of silicon dioxide) are particularly preferred for forming the gate dielectric 46. More preferably, the gate dielectric 46 comprises a hafnium-based high k dielectric material having a dielectric constant greater than about 10.0. Such hafnium-based dielectric material can be selected from hafnium oxide ($HfO_2$), hafnium silicate (HfSiO_), hafnium silicon oxynitride (HfSiON), a mixture of hafnium oxide and zirconium oxide ($ZrO_2$), or multilayers thereof. Most preferably, the gate dielectric 46 of the n-FET gate stack comprises hafnium oxide or hafnium nitride.

The gate dielectric 46 can be formed by a thermal growing process such as, for example, oxidation or oxynitridation. Alternatively, the gate dielectric 46 can be formed by a deposition process such as chemical vapor deposition (CVD), plasma-assisted CVD, physical vapor deposition (PVD), metalorganic chemical vapor deposition (MOCVD), atomic layer deposition (ALD), evaporation, reactive sputtering, chemical solution deposition, or any other suitable deposition processes.

The gate dielectric 46 may also be formed utilizing any combination of the above processes. The physical thickness of the gate dielectric 46 may vary, but typically, the gate dielectric 46 has a thickness from about 0.5 to about 10 nm, with a thickness from about 0.5 to about 3 nm being more typical.

The gate conductor 48 may comprise any suitable conductive material, such as metal, metal alloy, metal nitride, metal silicide, or a semiconductor material such as Si or SiGe alloy in polycrystalline or amorphous form. The gate conductor 48 can be formed by any known deposition processes, such as, for example, CVD, PVD, ALD, evaporation, reactive sputtering, chemical solution deposition, etc. When the gate conductor 48 comprises a semiconductor material, such a semiconductor material is preferably doped by either an in situ doping deposition process, or by deposition followed by ion implantation and annealing. The ion implantation and annealing can occur prior to or after a subsequent etching step that patterns the material stack. The doping of the semiconductor material will shift the work function of the gate conductor 48 so formed.

The thickness, i.e., height, of the gate conductor 48 may vary depending on the deposition process used. Typically, the gate conductor 48 has a vertical thickness from about 20 to about 180 nm, with a thickness from about 40 to about 150 nm being more typical.

Figure 3:
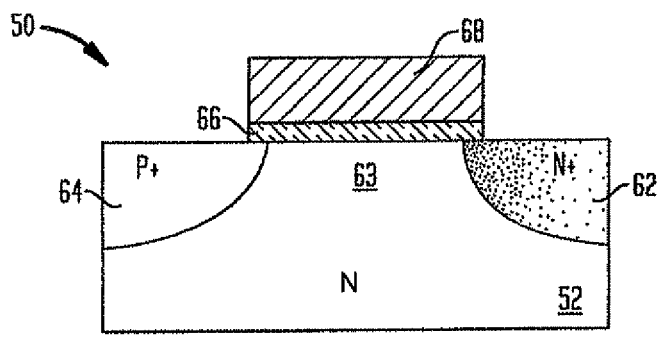
FIG. 3 shows a cross-sectional view of an exemplary SiC-based heterojunction p-channel TFET, according to one embodiment of the present invention.

FIG. 3 shows a cross-sectional view of an exemplary heterojunction p-channel TFET 50 formed in an n-well of a semiconductor substrate 52, according to one embodiment of the present invention.

The p-channel TFET 50 comprises a source region 62, a drain region 64, a channel region 63 located between the source and drain regions 62 and 64. A gate stack, which comprises a gate dielectric 66 and a gate conductor 68, is located over the channel region 63.

The drain region 64 of the p-channel TFET 50 comprises a first semiconductor material and is doped with a p-type dopant species. The first semiconductor material can comprise Si, Ge, SiGe, SiC or any other Group III-V semiconductor material. The p-type dopant species can be an element from Group IIIA of the Periodic Table of the Elements, such as aluminum, boron, gallium, indium, etc. The channel region 63 also comprises the first semiconductor material and is doped with the p-type dopant species.

The source region 62 of the p-channel TFET 50, on the other hand, comprises a second semiconductor material, which is different from that of first semiconductor material. The second semiconductor material is selected from the group consisting of Si, Ge, SiGe, SiC or any other Group III-V semiconductor material. Further, the source region 62 is doped with an n-type dopant species, which can be an element from Group VA of the Periodic Table of the Elements, such as nitrogen, phosphorous, arsenic, antimony, etc.

Figure 5:
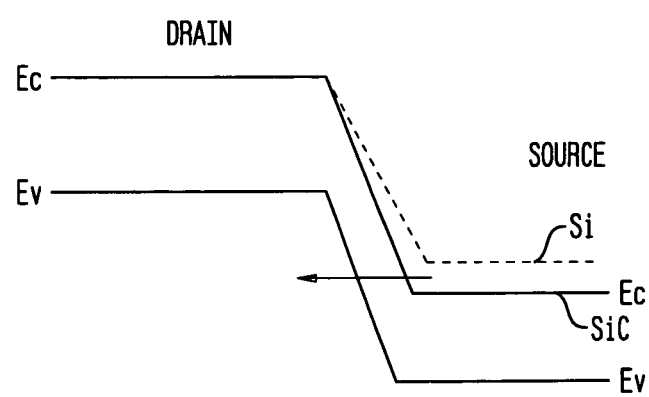
FIG. 5 shows the band graph of the SiC-based heterojunction p-channel TFET of FIG. 3, in comparison with that of a conventional p-channel TFET.

Preferably, the drain region 64 comprises silicon, and the source region 62 comprises SiC. By forming the source region 62 with SiC and the drain region 64 with silicon, a more abrupt junction with a smaller band gap is formed, as shown in FIG. 5 (the solid line indicates the band graph of a SiC n$^+$ source, in comparison with the band graph of a Si n$^+$ source indicated by the dashed line). As mentioned hereinabove, since the tunneling current $I=A \times exp^{(-Eg/2KT)}$, wherein A is a multiplicity factor, and Eg is the band gap of the semiconductor material used for forming the source region, provision of such an abrupt junction with a smaller band gap functions to enhance the tunneling current.

Preferably, the carbon content in the source region 62 at the junction immediately adjacent to the channel region 63 of the p-channel TFET 50 does not exceed the critical carbon content allowed as defined hereinbelow.

Pseudomorphically grown SiC film contains intrinsic strain caused by lattice mismatch between the silicon substrate (having a larger lattice constant) and the SiC film (having a smaller lattice constant). When the strain reaches a critical level, either due to increase of the SiC film thickness or increase of the C content, it can no longer be contained by elastic energy stored in the distorted SiC crystal structure. Instead, a portion of the strain will be relaxed through generation of misfit dislocations in the heteroepitaxial interface. Therefore, for a SiC film of a specific C content, there exists a "critical thickness," defined as the maximum thickness for the pseudomorphic growth of the SiC film, below which the strain caused by lattice mismatch between Si and C is contained by elastic energy stored in crystal lattice distortion, and above which a portion of the strain is relaxed through generation of misfit dislocations in the heteroepitaxial interface. Similarly, for a SiC film of a specific thickness, there exists a "critical C content," which is defined as the maximum carbon content that can be incorporated into the pseudomorphic SiC film, below which the strain caused by lattice mismatch between Si and C is contained by elastic energy stored in crystal lattice distortion, and above which a portion of the strain is relaxed through generation of misfit dislocations in the heteroepitaxial interface. Dislocation defects originated from strain relaxation are electrically active and can cause increased carrier scattering, carrier trapping, and carrier recombination. Therefore, it is preferred to maintain the C content and the thickness of a SiC-containing layer below the critical values, in order to avoid formation of dislocation defects in the device structure.

Critical carbon content for a SiC-containing layer can be readily calculated by various conventionally known methods. Typically, the critical carbon content is about 5 atomic %, but the specific critical carbon content depends on the thickness of the SiC-containing layer. Therefore, it is preferred that carbon content in the source region 62 at the junction immediately adjacent to the channel region 63 is less than or equal to about 5 atomic %, and more preferably ranges from about 1 atomic % to about 5 atomic %.

The SiC-containing source region 62 of the present invention may have a flat C content profile (i.e., a substantially uniform C content is provided across the entire source region 62), a multi-step C content profile (i.e., multiple plateaus of uniform C content are provided across the entire source region 62), or a graded C content profile (i.e., the C content in the source region 62 gradually increases or decreases), provided that the carbon content at the junction immediately adjacent to the channel region 63 is equal to, or close to, the critical carbon content. Preferably, the source region 62 has a graded C content profile, which may have any suitable shape, either regular or irregular and which decreases along a direction away from the channel region 63.

The heterojunction TFET of the present invention can be fabricated by using a conventional CMOS process flow, with few or no additional processing steps. Therefore, the heterojunction TFET of the present invention can be readily integrated side-by-side with MOSFET(s) to form improved CMOS circuits. For example, a heterojunction n-channel TFET of the present invention can be integrated with a p-channel MOSFET, or a heterojunction p-channel TFET of the present invention can be integrated with an n-channel MOSFET, to form an improved CMOS circuit.

FIGS. 6A-6F illustrate exemplary processing steps for fabricating a heterojunction TFET (either n-channel or p-channel) of the present invention.

Figure 6A:
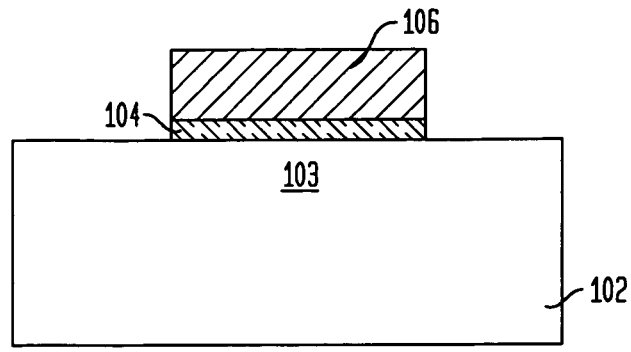
FIGS. 6A-6F illustrate exemplary processing steps for fabricating a heterojunction TFET of the present invention.

Reference is first made to FIG. 6A, which shows a patterned gate stack that comprises a gate dielectric 104 and a gate conductor 106 located over a semiconductor substrate 102. The patterned gate stack can be readily formed by first depositing a blanket gate dielectric layer (not shown) and a blanket gate conductor layer (not shown), followed by patterning of such blanket gate dielectric and gate conductor layers using conventional lithographic techniques.

Figure 6B:
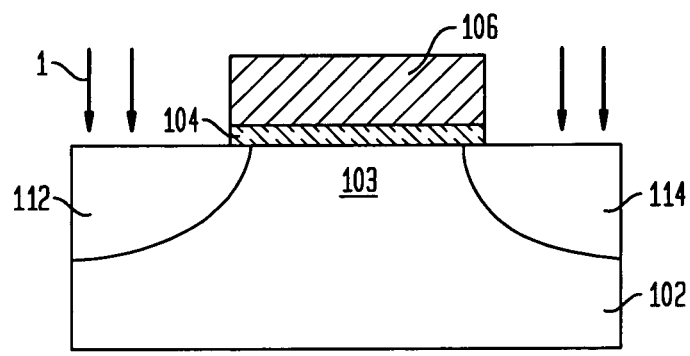

Next, an implantation step is carried out to implant the semiconductor substrate 102 with a first dopant species 1 (either n-type or p-type dopant). The patterned gate stack functions as a mask during such implantation step, thereby forming a first doped region 112 and a second doped region 114 that are both doped with the first dopant species 1, as shown in FIG. 6B. The first doped region 112 will function as the drain region for the heterojunction TFET to be formed, and the region 113 located underneath the patterned gate stack will function as the channel region.

Figure 6C:
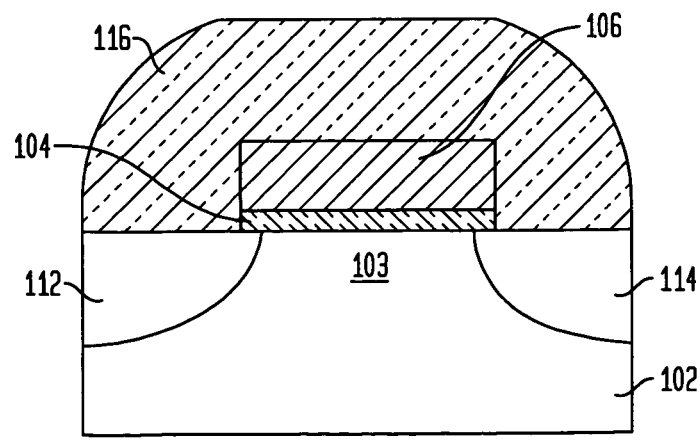

Subsequently, a dielectric masking layer 116, which comprises a dielectric masking material such as silicon nitride, is deposited over the entire structure, covering both the first and second doped regions 112 and 114 and the patterned gate stack, as shown in FIG. 6C.

Figure 6D:
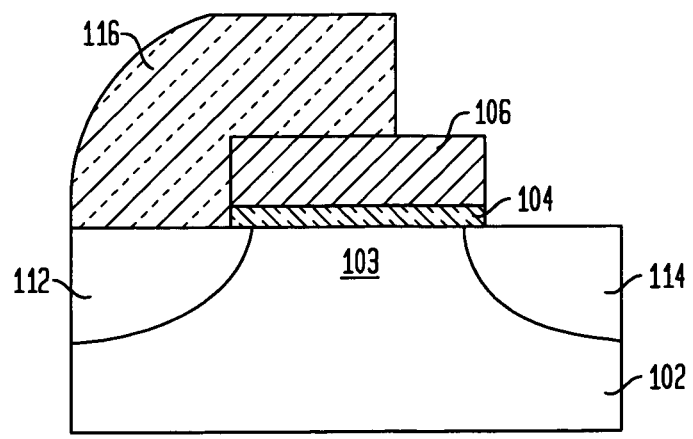

A portion of the dielectric masking layer 116 is then selectively removed from the second doped region 114, to thereby exposed an upper surface of the second doped region 114, as shown in FIG. 6D.

Figure 6E:
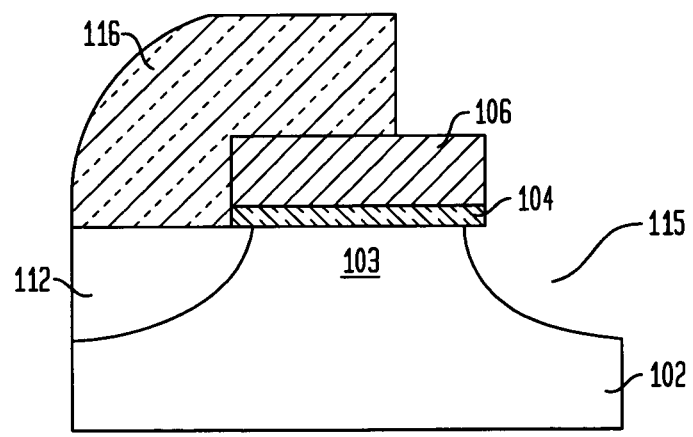

FIG. 6E shows selectively etching of the exposed second doped region 114, using the dielectric masking layer 116 as a mask, to form a recess 115 in the semiconductor substrate 102. The recess 115 preferably has a depth ranging from about 30 nm to about 150 nm.

Figure 6F:
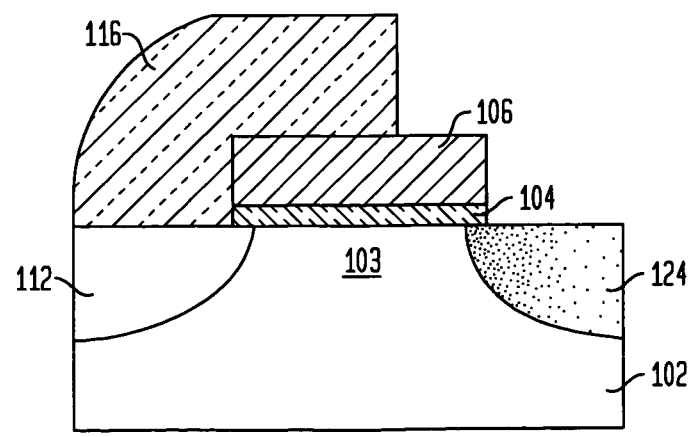

A heteroepitaxial growth step is then carried out to grow a semiconductor structure 124 in the recess 115, as shown in FIG. 6F. The semiconductor structure 124 will function as the source region for the heterojunction TFET device to be formed, and it therefore comprises a semiconductor material that is different from that contained by the semiconductor substrate 102. For example, when the semiconductor substrate 102 comprises silicon, the semiconductor substrate 124 comprises SiGe or SiC. For formation of an n-channel TFET device, the semiconductor structure 124 preferably comprises SiGe. For formation of a p-channel TFET device, the semiconductor structure 124 preferably comprises SiC.

The semiconductor structure 124 is doped by a second dopant species (not shown) that has a conductivity type opposite to the first dopant species 1. The doping of the semiconductor structure 124 can be either carried out via in situ doping during the epitaxial growth of the structure 124, or via dopant implantation after the epitaxial growth of the structure 124. After formation of the doped semiconductor structure 124, the dielectric hard mask layer 116 can then be removed from the substrate surface using conventional stripping techniques.

Preferably, but not necessarily, the heterojunction TFET devices of the present invention are characterized by a channel length ranging from about 0.2 µm to about 10 µm and a channel width ranging from about 0.02 µm to about 10 µm. More preferably, the channel length of the heterojunction TFET devices ranges from about 150 nm to about 250 nm, and the channel width ranges from about 0.5 µm to about 1.5 µm.

While FIGS. 2-3 and 6A-6F illustratively demonstrate several exemplary device structures and processing steps that can be used to form such device structures, according to specific embodiments of the present invention, it is clear that a person ordinarily skilled in the art can readily modify such device structures as well as the process steps for adaptation to specific application requirements, consistent with the above descriptions. For example, while the semiconductor substrates shown in FIGS. 2-3 and 6A-6F represent bulk semiconductor substrates, it should be appreciated that semiconductor-on-insulator (SOI) substrates can also be used for practice of the present application. For another example, while the device structures shown in FIGS. 2-3 are designed for use as field effect transistors in the CMOS technology, it is clear that a person ordinarily skilled in the art can readily modify the field effect transistors of the present invention for use in other applications, such as diodes on SOI substrates, etc. It should therefore be recognized that the present invention is not limited to the specific embodiment illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. A tunneling field effect transistor (TFET) comprising:
a drain region that is composed of p-type conductivity Si;
a source region spaced apart from the drain region, wherein said source region is composed of n-type conductivity SiC having a smaller band gap than Si, wherein a carbon content of the SiC ranges from 1% to 5%;
a channel region located between the source and drain regions, wherein the channel region is positioned in an n-type well; and
a gate stack located over the channel region, wherein said gate stack comprises at least a gate dielectric and a gate conductor.

2. The TFET of claim 1, wherein the channel region has a channel length ranging from about 0.2 µm to about 10 µm.

3. The TFET of claim 2, wherein the channel region has a channel width ranging from about 0.02 µm to about 10 µm.

4. A semiconductor device comprising:
a semiconductor substrate,
a tunneling field effect transistor (TFET) comprising spaced apart source and drain regions with a channel region located therebetween and a gate stack located over the channel region, wherein the source, drain, and channel regions of the TFET are located in an n-type conductivity well in the semiconductor substrate,
wherein the drain region of the TFET is composed of p-type conductivity Si, wherein the source region of the TFET is composed of n-type conductivity SiC having a smaller band gap than Si, wherein a carbon content of the SiC ranges from 1% to 5%; and
wherein the gate stack of the TFET comprises at least a gate dielectric and a gate conductor; and
a metal-oxide-semiconductor field effect transistor (MOSFET) adjacent to the TFET,
wherein the MOSFET comprises spaced apart source and drain regions with a channel region located therebetween and a gate stack located over the channel region, and wherein the source, drain, and channel regions of the MOSFET are located in the semiconductor substrate.

5. The semiconductor device of claim 4, wherein the MOSFET is an n-channel MOSFET.

* * * * *